United States Patent [19]
Yanof et al.

[11] Patent Number: 5,513,430
[45] Date of Patent: May 7, 1996

[54] METHOD FOR MANUFACTURING A PROBE

[75] Inventors: Arnold W. Yanof, Tempe; William Dauksher, Mesa, both of Ariz.

[73] Assignee: Motorola, Inc., Schaumburg, Ill.

[21] Appl. No.: 293,365

[22] Filed: Aug. 19, 1994

[51] Int. Cl.$^6$ ...................................................... H05K 3/02
[52] U.S. Cl. .................... 29/846; 174/260; 437/8
[58] Field of Search ................ 174/260; 29/846, 29/407; 437/8

[56] References Cited

U.S. PATENT DOCUMENTS

| | | |
|---|---|---|
| 3,445,770 | 5/1969 | Harmon . |
| 3,905,098 | 9/1975 | Garretson et al. .............. 29/846 X |
| 4,563,640 | 1/1986 | Hasegawa ...................... 324/158 |
| 4,924,589 | 5/1990 | Leedy ............................. 29/846 X |
| 5,020,219 | 6/1991 | Leedy ............................. 29/846 |
| 5,042,148 | 8/1991 | Tada et al. ..................... 29/846 X |
| 5,060,371 | 10/1991 | Stewart et al. ................ 29/846 X |
| 5,090,118 | 2/1992 | Kwon et al. ................... 29/846 X |
| 5,103,557 | 4/1992 | Leedy ............................. 29/846 X |
| 5,191,708 | 3/1993 | Kasukabe et al. ............. 29/846 |

FOREIGN PATENT DOCUMENTS 0368262  5/1990  European Pat. Off. .

OTHER PUBLICATIONS

Munchmeyer et al., "Manufacture of three-dimensional microdevices using synchrotron radiation (invited)", Rev. Sci Instrum. 63(1), Jan. 1992, pp. 713–721.

C. Barsotti et al., "Very High Density Probing", 1988 International Test Conference, Paper 30.2, pp. 608–614.

*Primary Examiner*—Carl J. Arbes
*Attorney, Agent, or Firm*—Rennie William Dover

[57] ABSTRACT

A probe card (40, 55) having probe card probes (36, 56) and a method for fabricating the probe card probes (36, 56). A layer of resist (23) is formed on a plating base (21). The layer of resist (23) is exposed to radiation (32) and developed to provide angled, tapered openings (33) exposing portions of the plating base (22). An electrically conductive material is electroplated on the exposed portions of the plating base (22) and fills the angled, tapered openings (33). The layer of resist (23) and portions of the plating base (22) between the electroplated conductive material are removed. The electrically conductive material forms the probe card probes (36) which are angled and tapered. In addition, the compliant probe card probes (56) may be stair-step shaped.

17 Claims, 3 Drawing Sheets

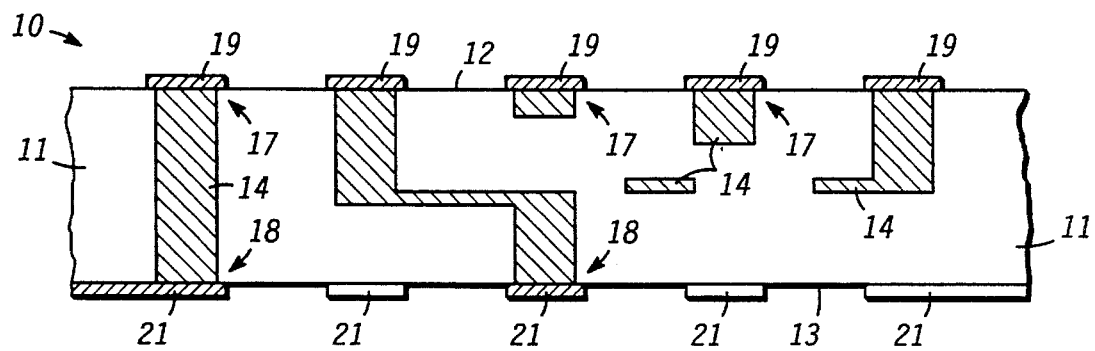
FIG. 1 —PRIOR ART—
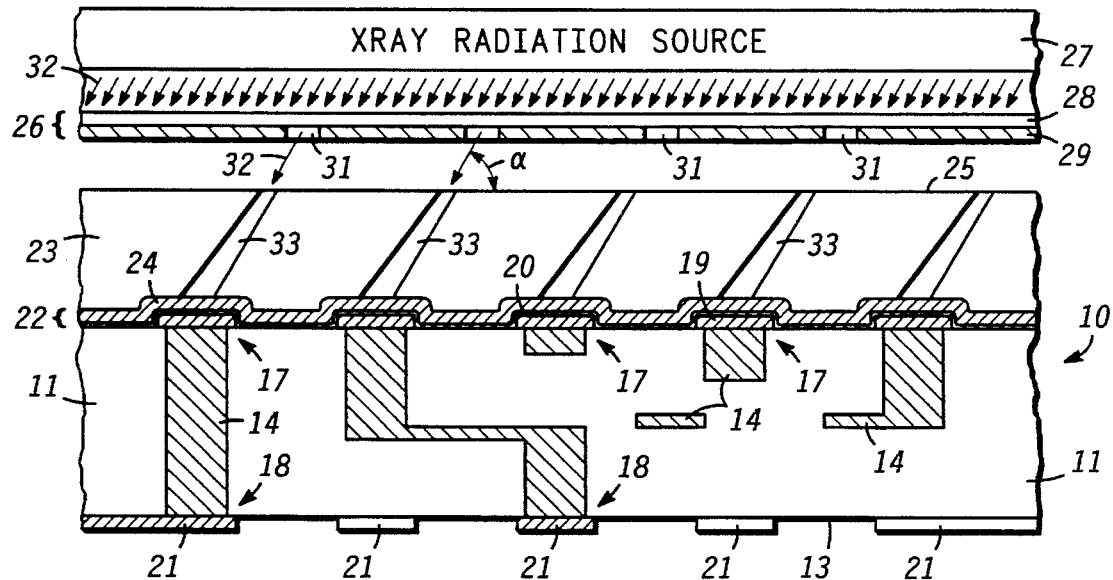
FIG. 2
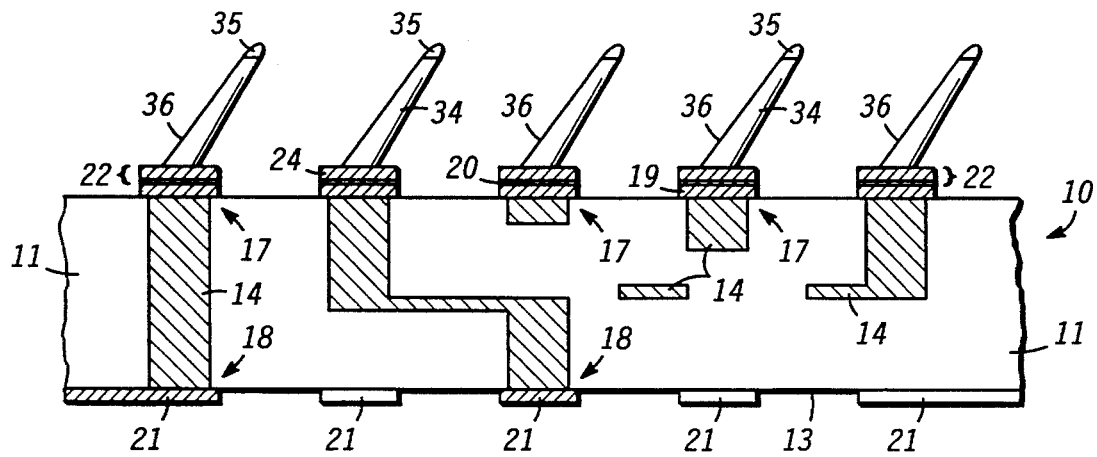
FIG. 3

METHOD FOR MANUFACTURING A PROBE

The present application is related to U.S. Pat. No. 5,476,818 issued to Arnold W. Yanof et al. on Dec. 19, 1995, and assigned to the same assignee, Motorola, Inc.

BACKGROUND OF THE INVENTION

The present invention relates, in general, to probe cards, and more particularly, to probe card probes and methods for manufacturing probe card probes.

In an effort to preclude packaging defective semiconductor chips or dice, semiconductor device manufacturers have developed techniques for testing semiconductor chips in both wafer and chip or die form. For example, Hasegawa teaches in U.S. Pat. No. 4,563,640, a fixed probe board for testing semiconductor wafer chips. The probe board comprises a multiplicity of probe needles mounted to a support base, wherein the configuration of probe needles matches an array of electrode pads spread around the periphery of the integrated device to be tested. Although this invention has provided a means for testing unencapsulated integrated devices, it is impractical for testing integrated devices having a large number of electrode pads spread across the surface of the integrated device, i.e., electrode pads configured in an area array. Further, the difference between the coefficients of thermal expansion of the probe board and the device under test may result in a high impedance contact between the probe needles and the electrode pads on the semiconductor device.

B. Leslie and F. Matta, in their paper "Membrane Probe Card Technology," presented at the 1988 International Test Conference, addressed the limitations of conventional probe cards. Moreover, they have described a probe card in which the probe needles were replaced with contact bumps formed on a flexible dielectric membrane. The contact bumps have limited compliance and rely upon the compliance of the membrane material both to conform vertically to variations in the pad heights and to wipe the pad surface laterally to make good electrical contact. In addition, a substantial force must be applied to the die under test in order to achieve good contact.

Accordingly, it would be advantageous to have compliant probe card probes capable of temporarily contacting bonding pads on semiconductor chips and a means for fabricating the probe card probes. The resiliency of the probe card probes should permit them to contact bonding pads of different heights without damaging the probe card probes or the semiconductor chips. It would be of further advantage for the probe card probes to have sufficient resiliency to preclude permanent deformation when contacting semiconductor chips.

BRIEF DESCRIPTION OF THE DRAWINGS

FIG. 1 illustrates an enlarged cross-sectional view of a prior art support structure;

FIG. 2 illustrates a highly enlarged cross-sectional view of the support structure of FIG. 1 during irradiation in accordance with the first embodiment of the present invention;

FIG. 3 illustrates a highly enlarged cross-sectional view of probes in accordance with the first embodiment of the present invention;

DETAILED DESCRIPTION OF THE DRAWINGS

Figure 4:
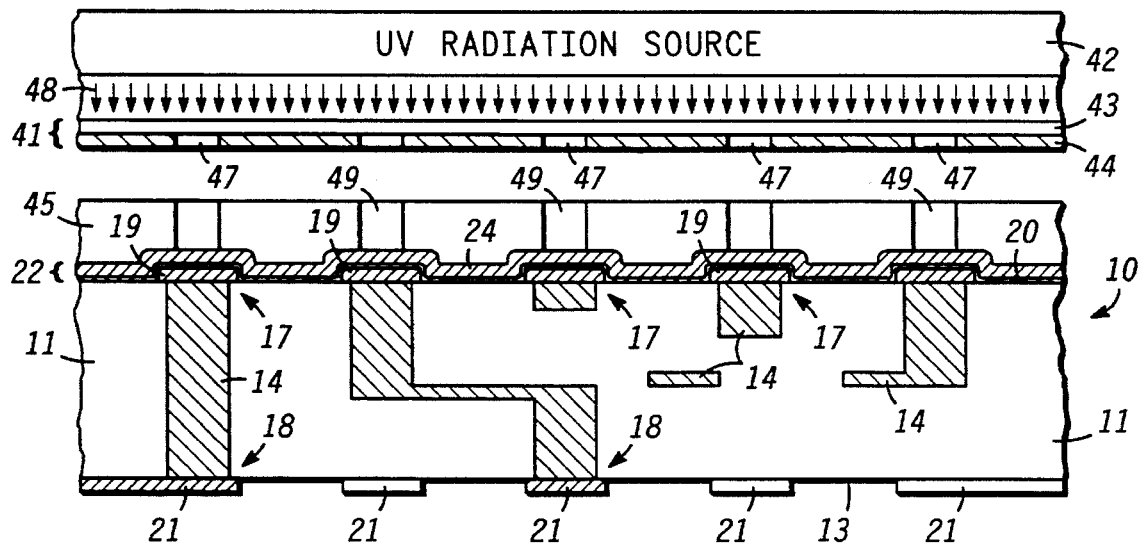
FIG. 4 illustrates an enlarged cross-sectional view of a support structure during irradiation in accordance with a second embodiment of the present invention.

Generally, the present invention provides a method and a means for manufacturing a probe which can be used, for example, to test integrated devices. In accordance with a first embodiment of the present invention, the probe is manufactured by irradiating a layer of resist with off-angle x-ray radiation. In addition, the off-angle x-ray radiation may be transmitted at various angles to form tapered probes. It should be noted that off-angle x-ray radiation is defined as radiation traveling in a direction that is non-normal to a surface along its travel path. In other words, off-angle x-ray radiation arriving at the surface makes an acute angle with the surface. The exposed portions of the layer of resist are removed, thereby forming openings which are subsequently filled with a conductive material to form the probes. Preferably, the remaining portion of the layer of resist is removed.

In accordance with a second embodiment of the present invention, the probe is manufactured by irradiating portions of a first layer of resist with deep ultraviolet radiation. The exposed portions of the first layer of resist are removed to form openings which are subsequently filled with a conductive material. The conductive material and the first layer of resist are coated with a second layer of resist. Portions of the second layer of resist are irradiated with the deep ultraviolet radiation. In particular, the portions of the second layer of resist over a central portion of the conductive material and overlapping or extending over an edge of the conductive material are exposed to the ultraviolet radiation. The exposed portions of the second layer of resist are removed to form openings which are then filled with a conductive material, wherein the conductive material filling the openings serves as the probe. This process of resist coating, exposure, removal of exposed resist, and filling with a conductive material may be repeated until a desired probe height or configuration is achieved. Preferably, the remaining portions of the layers of resist are removed. It should be noted that probes are often built on probe cards, thus they are also referred to as probe card probes.

FIG. 1 illustrates an enlarged cross-sectional view of a prior art support structure 10. Preferably, support structure 10 comprises a substrate 11 having major surfaces 12 and 13. Metal filled vias 14 extend through substrate 11 wherein one end 17 of each metal filled via 14 may terminate at surface 12 and a second end 18 of each metal filled via 14 may terminate at surface 13. It should be understood that the vias are not limited to vias extending through substrate 11, i.e., the metal filled vias 14 may terminate on interconnects, signal planes, ground planes, power planes, other metal filled vias, and the like. Contact pads 19 are formed on major surface 12 and in contact with ends 17. Likewise, contact or interconnect pads 21 are formed on major surface 13 and in contact with second ends 18. It should be understood that structures 21 are not limited to contact pads but may be conducting feedouts or electrical interconnects. Suitable materials for substrate 11 include polyimide, FR-4, bismaleimide triazine (BT) resin, ceramic materials, and the like.

By way of example, support structure 10 is a printed circuit board. Techniques for manufacturing support structures such as printed circuit boards are well known to those skilled in the art.

FIG. 2 illustrates a highly enlarged cross-sectional view of support structure 10 of FIG. 1 during irradiation by x-ray radiation in accordance with the first embodiment of the present invention. It shall be understood that the same reference numerals are used in the figures to denote the same elements. What is shown in FIG. 2 is support structure 10 having a plating base or base plate 22 formed on major surface 12 and contact pads 19. Plating base 22 provides a conductive path for the formation of probe tips (reference numeral 36 of FIG. 3) by electrodeposition. In one embodiment, plating base 22 is a two layer structure comprising an adhesion layer 20 having a plating seed layer 24 disposed thereon. Suitable materials for the adhesion layer 20 include titanium, chromium, and the like, whereas suitable materials for plating seed layer 24 include gold, nickel, and the like. By way of example, adhesion layer 20 is titanium having a thickness of approximately 100 angstroms and plating seed layer 24 is gold having a thickness of approximately 200 angstroms. It should be understood that the thicknesses of layers 20 and 24 are not limitations of the present invention. It should be further understood that, in accordance with the deposition process, layers 20 and 24 are conformal layers; however, layers 20 and 24 being conformal is not a limitation of the present invention. For example, the thickness of layers 20 and 24 may be increased to add mechanical stability to probe tips 36 shown in FIG. 3. Further, the mechanical stability of probe tips 36 shown in FIG. 3 may be further increased by etching wells or indentations (not shown) into substrate 11 at locations where conductive pads 19 are to be formed. These wells increase the mechanical stability of the probe tips by increasing the size of the base regions of the probe tips. It should also be noted that formation of the plating base may be omitted if contact pads 19 or ends 17 of metal filled vias 14 are accessible to the cathode of the plating equipment, i.e., contact pads 19 or ends 17 serve as the plating base.

In addition, FIG. 2 illustrates an x-ray mask 26 coupled to an x-ray radiation source 27. It should be understood that x-ray radiation source 27 shown in FIG. 2 emits X rays and is merely a representation of x-ray radiation sources that are well known to those skilled in the art. X-ray mask 26 comprises a thin membrane of low atomic weight material 28 having a patterned layer of high atomic weight material 29 disposed thereon. X rays are capable of traveling through thin membrane 28 but are absorbed by the high atomic weight material 29. Thus, high atomic weight material 29 is also referred to as an absorbing material. Absorbing material 29 is patterned to have openings 31 through which x-ray radiation travels. Suitable materials for thin membrane 28 include $Si_xN_y$, SiC, diamond, doped Si and the like, whereas suitable materials for the high atomic weight material include gold, tungsten, tantalum, and the like. It should be understood by those skilled in the art that in the formula $Si_xN_y$, the variables x and y are real numbers that represent atomic ratios of the constituent elements, e.g. stoichiometric silicon nitride is represented by $Si_3N_4$. It should be noted that x-ray masks such as x-ray mask 26 are well known in the art and the x-ray mask is not limited to a thin membrane of low atomic weight material having a patterned layer of high atomic weight material disposed thereon. For example, x-ray mask 26 may be a self-supporting sheet of metal having holes cut therethrough using laser ablation. Further, x-ray radiation sources such as source 27 are also well known to those skilled in the art. For example, x-ray radiation source 27 may be a synchrotron. Other examples of x-ray radiation sources 27 include conventional metal anode x-ray tubes, plasma sources, focused laser plasma sources, and the like. It should be understood that the material for x-ray mask 26 and the type of x-ray radiation source 27 are not limitations of the present invention.

Plating base 22 is coated with a layer of resist 23 such as, for example, polymethylmethacrylate (PMMA) having a thickness ranging between approximately 50 microns (μm) and approximately 500 μm. Other suitable materials for layer of resist 23 include fluorinated polybutylmethacrylate, polymethacrylimide (PMI) , polyoxymethylene (POM), and polyalkensulfone (PASO) . It should be understood that resists for use in deep-etch x-ray lithography are well known to those skilled in the art.

In accordance with the first embodiment of the present invention, x-ray radiation source 27 transmits x-ray radiation (shown by arrows 32) towards x-ray mask 26. Although x-ray radiation 32 is absorbed by absorbing material 29, it travels through openings 31 and irradiates the portions of layer of resist 23 that are to be removed. Preferably, x-ray radiation 32 is transmitted at an angle so that it irradiates layer of resist 23 at an acute angle α relative to a top surface 25 of layer of resist 23. In other words, angle α is non-normal to surface 25. The angle α is also referred to as being an off-angle since it is oblique to surface 25. Preferably, acute angle α ranges between approximately 65 and 85 degrees. In addition, it is preferable to vary angle α in one or both directions, i.e. vary angle α up and down, or sideways, or in a combined elliptical motion to expose a greater portion of layer of resist 23 at plating base 22 than at top surface 25. Thus, the exposed portions of layer of resist 23 have a tapered shape having a longitudinal axis making an angle α relative to top surface 25.

Preferably, the exposing radiation has a sufficiently short wavelength, e.g., less than approximately 5 angstroms (Å), to penetrate the thickness of layer of resist 23 and to provide exposure of the resist down to the plating base 22. It should be understood that although x-ray lithography for integrated circuits is optimized at longer wavelengths, the harder x-rays are readily available from the same sources through the proper choice of operating parameters and beamline components.

It should be noted that x-ray lithography in accordance with the present invention differs from that used in standard integrated circuit and deep-etch lithography, electroforming, and moulding (LIGA) lithography techniques in that a reduced degree of collimation is required. LIGA is an acronym derived from a process described in the German language as Lithographie, Galvanoformung, Abformung. Therefore, the source and beamline of the x-ray radiation in the present invention is optimized for the intensity of radiation to reduce exposure time at the expense of coherence and source spot size. For example, in the case of compact sources, e.g., non-synchrotron sources, the exposure can be performed at a reduced distance from the source, as compared with x-ray lithography used in the manufacture of integrated circuits. The intensity of radiation and the consequent rate of exposure at the resist is then increased as the inverse square of the distance to the source. The increased penumbra effect helps produce the desired taper in the probe tip and thus is beneficial.

Further and in contrast to x-ray lithography for integrated circuit and LIGA applications, where strictly normal incidence of radiation is required, lithographic techniques in accordance with the present invention use a mechanical fixture to set and to vary an oblique angle of incidence of the radiation. Moreover, x-ray lithography for integrated circuit applications requires high resolution masks and a gap of approximately 40 microns or less between mask and wafer to prevent blurring due to penumbral and diffraction effects. The x-ray lithographic technique in accordance with the present invention, on the other hand, uses a low resolution mask, wherein the gap between mask and wafer can be greater than 100 microns. Thus, the x-ray lithographic technique of the present invention uses a less costly and more physically robust x-ray mask, as well as a much less costly mask-to-substrate alignment tool than conventional photolithographic techniques used for the manufacture of integrated circuits. For example, the mask for the present invention can be manufactured by laser ablation of a 25 micron thick tungsten sheet to provide a very low cost mask with sufficient precision.

The exposed portions of layer of resist 23 are developed using a developer such as, for example, methyl isobutyl ketone (MIBK) and isopropyl alcohol (IPA), and rinsed to form openings 33. It should be noted that openings 33 are tapered having a greater diameter at plating base 22 than at top surface 25. In addition, a longitudinal axis of openings 33 makes an angle α relative to plating base 22 and to top surface 25.

Now referring to FIG. 3, probes 36 are formed on support structure 10 by electroplating a conductive material on the exposed portions of plating base 22, thereby forming a probe card or probe structure 40. The electroplating material fills openings 33 (shown in FIG. 2). Suitable electroplating materials include nickel, gold, a combination of nickel and gold, copper, palladium, tin, and the like. As those skilled in the art will appreciate, a combination of layers of the electroplating materials may be used to enhance the strength of the base region and lower the contact resistance at the tip. For example, a base 34 of probe 36 may be formed by partially filling opening 33 with nickel and the tip region 35 of probe 36 may be formed by partially filling opening 33 with one of gold or palladium. The nickel provides strength to probe 36, whereas the gold lowers the contact resistance between probe 36 and a structure contacted by probe 36.

The remaining portions of layer of resist 23 are removed using techniques well known to those skilled in the art. In addition, the portions of plating base 22 between conductive pads 19 are removed to expose surface 12. In other words, conductive pads 19 are electrically isolated from one another. Techniques for selectively removing portions of a plating base 22 are known to those skilled in the art.

Probes 36 are tapered and have a longitudinal axis that makes an acute angle α relative to plating base 22. Preferably, the portion of probes 36 in contact with plating base 22, i.e., the base portion of probes 36 have a diameter of approximately 25 μm and the portions of probe 36 that form the tip have a diameter of approximately 10 μm. Tapering probes 36 allows them to scrub bonding pads (not shown) when contacting the bonding pads and distributes stress so that elastic compliance at the tip is maximized, while stress concentration at the base is avoided. Angling probes 36 so that they have a longitudinal axis that makes the acute angle α provides probes 36 with compliance in both normal and lateral directions; therefore, probes 36 will contact pads with a low-force scrubbing action and accommodate pads of differing height without buckling.

FIG. 4 illustrates an enlarged cross-sectional view of a support structure 10 (shown in FIG. 1) coated with a layer of resist 45 and being irradiated with ultraviolet radiation. Examples of suitable materials for layer of resist 45 include commercially available novolac based resists in the longer wavelength UV range, and chemically amplified t-butoxycarbonyl (TBOC) based resists in the shorter wavelength UV range. Preferably layer of resist 45 has a thickness ranging between approximately 10 um and approximately 60 μm. Resists for use in ultraviolet lithography are well known to those skilled in the art.

In addition, FIG. 4 illustrates a UV mask 41 coupled to a UV radiation source 42. UV radiation mask 41 comprises a thick quartz plate 43 having a patterned layer of chromium 44 disposed thereon. UV radiation is capable of traveling through quartz plate 43 but is absorbed by chromium 44. Thus, material 44 is also referred to as an absorbing material. Absorbing material 44 is patterned to have openings 47 through which UV radiation 48 travels. It should be noted that UV masks such as UV mask 41 are well known in the art. Further, UV radiation sources such as source 42 are also well known to those skilled in the art. For example, UV radiation source 27 may be a mercury i-line source (lamp). Other examples of a UV radiation source 42 include other radiation lines in the UV (lamp sources) and excimer lasers. It should be understood that the material for UV mask 41 and the type of UV radiation source 42 are not limitations of the present invention.

In accordance with the second embodiment of the present invention, UV radiation source 42 transmits UV radiation (shown by arrows 48) toward UV mask 41. Although UV radiation 48 is absorbed by absorbing material 44, it travels through openings 47 and irradiates the portions of layer of resist 45 that are to be removed. Preferably, the thickness of layer of resist 45 is approximately 50 microns at each exposure step to mitigate the diffraction and absorption effects of the UV radiation. For example, a probe structure may include construction in several 50 micron steps to attain the desired vertical dimension. The tapered, oblique design of the probe structure is created by selection of the sizes of mask opening 47 and alignment to previous layers at each step. The sizes and offsets of openings 47 are selected to provide the proper horizontal and vertical compliance in the final structure.

It should be noted that layer of resist 45 is preferably chosen for high sensitivity and low absorption of UV radiation at the expense of high resolution. The size of openings 47 and alignment tolerances in accordance with the present invention are much less critical than the tolerances for conventional integrated circuit photolithographic techniques. Therefore, the cost of the masks and alignment tools is less than for conventional photolithographic techniques.

The exposed portions of layer of resist 45 are developed using a developer such as, for example, tetramethyl ammonium hydroxide (TMAH), and rinsed to form openings 49.

Figure 5:
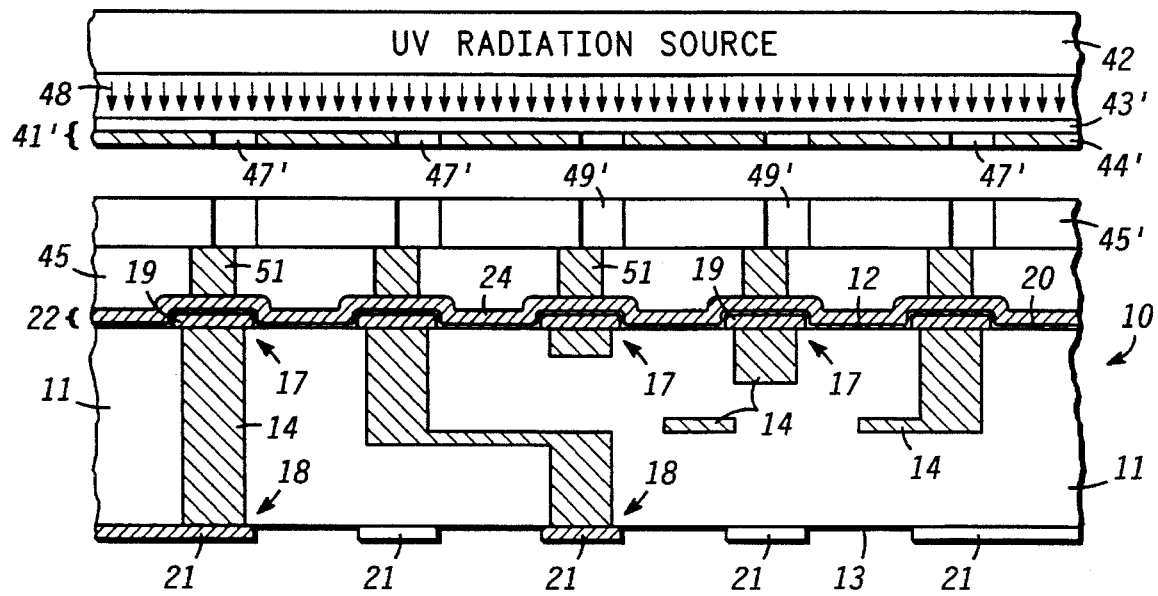
FIG. 5 illustrates an enlarged cross-sectional view of the support structure of FIG. 4 during another irradiation step in accordance with the second embodiment of the present invention.

Now referring to FIG. 5, a first portion 51 of probes 56 (shown in FIG. 6) is formed by electroplating a conductive material on the exposed portions of plating base 22. The electroplating material fills openings 49 (shown in FIG. 4). Suitable materials for electroplating include nickel, gold, a combination of nickel and gold, copper, palladium, tin, and the like. Layer of resist 45 and first portions 51 of probe 56 are covered by another layer of resist 45'. UV radiation source 42 transmits UV radiation (shown by arrows 48) toward UV mask 41'. UV radiation mask 41' comprises a thick quartz plate 43' having a patterned layer of absorbing material 44' disposed thereon. UV radiation is capable of traveling through the thick quartz plate 43' but is absorbed by the absorbing material 44'. Absorbing material 44' is patterned to have openings 47' through which UV radiation travels. Although UV radiation 48 is absorbed by absorbing material 44', it travels through openings 47' and irradiates the portions of layer of resist 45' that are to be removed and thereby form openings 49'. It should be noted that openings 47' of UV mask 41' are slightly offset from openings 47 of UV mask 41. This offset provides a stair-step shape for probes 56. In addition, the number of steps is selected by the desired height and compressibility of probes 56. In other words, the steps of forming the portions of probe 56 may be repeated until probe 56 has the desired cross sectional profile.

Figure 6:
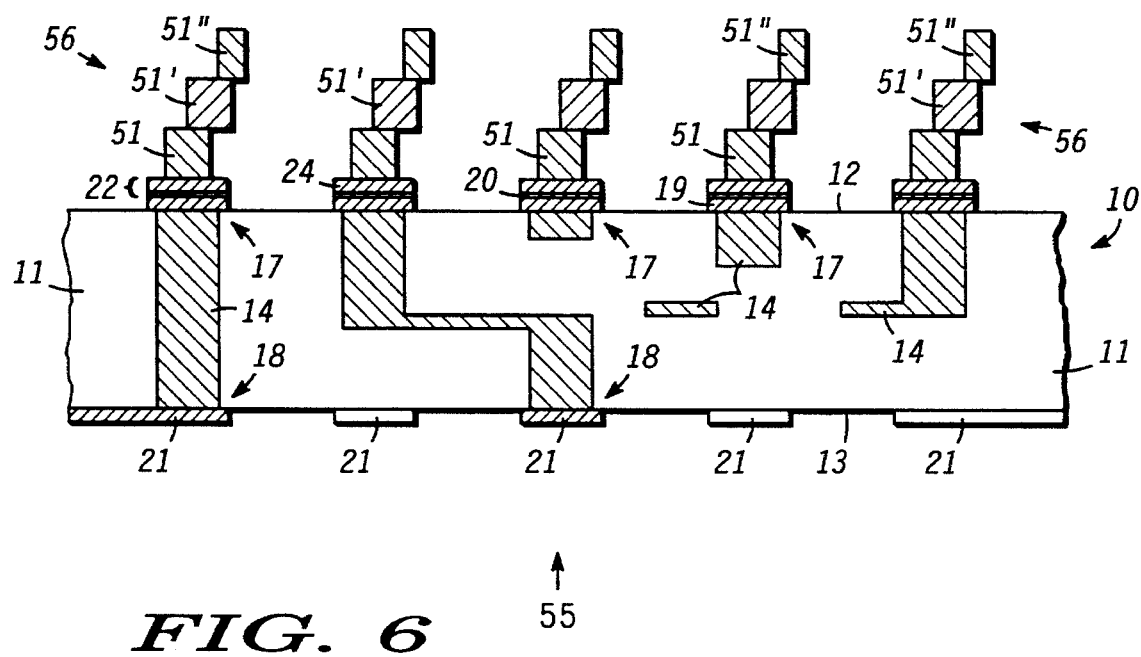
FIG. 6 illustrates a highly enlarged cross-sectional view of probes in accordance with the second embodiment of the present invention.

Now referring to FIG. 6, a probe card 55 having a plurality of probes 56 is illustrated. Probes 56 comprise a plurality of portions 51, 51', and 51" formed on top of each other Each of portions 51, 51', and 51" are formed using successive lithographic and plating steps. It should be noted that the size of each portion 51, 51', and 51" is not a limitation of the present invention. For example, each successive portion 51' and 51" may be smaller or have less area than a preceding portion. In this fashion, it is possible to produce a tapered structure that has all the desirable mechanical and physical properties for use as a probe tip. Alternatively, cantilever structures can also be produced.

It should be understood that the sequence of processing steps is not a limitation of the present invention. For example, layer of resist 45 may be removed prior to formation of subsequent photoresist layers, i.e., 45'; layers of resist 45 and 45' may be removed in a single step; layers of resist 45 and 45' may be developed in a single step; or layers of resist may also be interleaved with separate plating base layers at each electrodeposition step. In addition, the portions of plating base 22 between conductive pads 19 are removed to expose surface 12. In other words, conductive pads 19 are electrically isolated from one another. Techniques for selectively removing portions of a plating base 22 are known to those skilled in the art.

By now it should be appreciated that probes which can be used in such applications as testing integrated devices and a method for their manufacture has been provided. One advantage of the present invention is that the probes are fabricated using lithographic techniques, thus they can be fabricated in a peripheral array or in an area array. Accordingly, the bonding pad configuration on a semiconductor chip is not a limitation of the present invention, whether the density of bonding pads is high or low. Another advantage of the present invention is that the probes are angled to provide compliance in a vertical direction. In other words, the probes of the present invention are tilted so that they can be moved in a direction normal to the surface of a probe card. Thus the probes are strong, compliant, and capable of scrubbing bonding pads on a semiconductor chip. Since bonding pads on a semiconductor die may have different heights, the compliance of the probes permits the probes to contact bonding pads of different heights without damaging the probes or the semiconductor chip. Yet another advantage of the present invention is that the probes horizontally scrub the bonding pads to provide electrical contact between the probes and the bonding pads due to horizontal compliance. Further, probes manufactured in accordance with the present invention permit repeatable make and break contact with bonding pads.

What is claimed is:

1. A method for manufacturing a probe, comprising the steps of:

providing a support structure having a first surface and at least one contact pad;

forming a first layer of resist over the first surface and the at least one contact pad;

forming at least one opening through the first layer of resist, the at least one opening having a longitudinal axis that makes an acute angle with the first surface;

filling the at least one opening with a conductive material; and removing at least a portion of the first layer of resist adjacent the conductive material, wherein the conductive material serves as the probe.

2. The method of claim 1, wherein the step of forming a first layer of resist over the first surface comprises the steps of:

forming a plating base on the first surface and on the at least one contact pad; and forming the first layer of resist on the plating base.

3. The method of claim 2, wherein the step of removing at least a portion of the first layer of resist includes removing the plating base adjacent the at least one contact pad, wherein the first surface is uncovered.

4. The method of claim 1, wherein the step of forming at least one opening through the first layer of resist includes exposing a portion of the first layer of resist to radiation, wherein the radiation arriving at the first layer of resist forms an acute angle with a major surface of the first layer of resist and removing the exposed portion of the first layer of resist.

5. The method of claim 1, wherein the step of exposing a portion of the first layer of resist to radiation includes exposing the first layer of resist to X rays.

6. The method of claim 1, wherein the step of removing at least a portion of the first layer of resist includes removing substantially all of the first layer of resist over the first surface.

7. The method of claim 1, wherein the step of forming at least one opening includes forming the at least one opening having a tapered shape.

8. The method of claim 1, wherein the step of filling the at least one opening includes electroplating a metal selected from the group of gold, nickel, palladium, copper, and tin.

9. The method of claim 1, wherein the step of filling the at least one opening includes partially filling the at least one opening with nickel and partially filling the at least one opening with one of gold or palladium, wherein the one of gold or palladium covers the nickel.

10. The method of claim 1, wherein the steps of forming at least one opening through the first layer of resist and filling the at least one opening with a conductive material comprise the steps of:

exposing a portion of the first layer of resist with radiation;

removing the exposed portion of the first layer of resist to form a first opening;

filling the first opening with a first conductive material;

forming a second layer of resist on the first layer of resist and the conductive material;

exposing a portion of the second layer of resist, wherein the portion of the second layer of resist overlaps an edge of the conductive material;

removing the exposed portion of the second layer of resist to form a second opening; and filling the second opening with a second conductive material.

11. The method of claim 10, wherein the steps of exposing the portion of the first layer of resist and the portion of the second layer of resist include exposing the portion of the first layer of resist and the portion of the second layer of resist to ultraviolet radiation.

12. The method of claim 10, wherein the steps of filling the first opening and filling the second opening include using the same conductive material for the first conductive material and the second conductive material.

13. A method for manufacturing a probe for mating with an integrated device, comprising the steps of:

providing a support structure having a first surface and a contact pad formed thereon;

covering the first surface and the contact pad with a plating base;

covering the plating base with a layer of resist;

forming an opening through a portion of the layer of resist to uncover at least a portion of the contact pad, wherein the opening has a non-normal longitudinal axis to the contact pad;

filling the opening with at least one conductive material, the at least one conductive material serving as the probe; and removing a portion of the plating base adjacent the probe.

14. The method of claim 13, wherein the step of covering the plating base includes covering the plating base with a material selected from the group polymethylmethacrylate, fluorinated polybutylmethacrylate, polymethacrylimide, polyoxymethylene, and polyalkensulfone.

15. The method of claim 13, wherein the step of forming an opening through a portion of the layer of resist comprises exposing a portion of the layer of resist to X rays.

16. The method of claim 13, wherein the step of filling the opening includes electroplating a metal onto the at least a portion of the contact pad that is uncovered.

17. The method of claim 13, wherein the step of forming an opening through a portion of the layer of resist includes forming an opening having a tapered shape.

* * * * *